Figure 1:
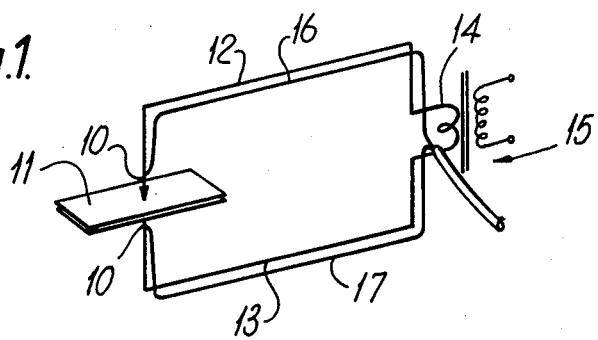

United States Patent [19]

Sugimoto

[11] 4,403,132
[45] Sep. 6, 1983

[54] INDUCTION COMPENSATING METHOD AND APPARATUS FOR WELD NUGGET RESISTANCE SENSING LEADS OF SPOT WELDERS

[75] Inventor: Nobuo Sugimoto, Yokohama, Japan

[73] Assignee: Aro Machinery Company, Ltd., London, England

[21] Appl. No.: 284,874

[22] Filed: Jul. 20, 1981

[30] Foreign Application Priority Data

Jul. 31, 1980 [GB] United Kingdom ............... 8025054

[51] Int. Cl.³ ............................................. B23K 11/24
[52] U.S. Cl. ................................... 219/109; 219/110
[58] Field of Search ............................... 219/109, 110

[56] References Cited
U.S. PATENT DOCUMENTS 2,370,009  2/1945  Clark et al. .................... 219/110
2,486,552  11/1949  Callender ........................ 219/110

Primary Examiner—C. C. Shaw
Attorney, Agent, or Firm—Howard L. Rose

[57] ABSTRACT

In an electrical spot welding machine having sensor leads for monitoring weld nugget resistance connected to the electrodes or to the welding current conductors, the voltage component induced in the sensor leads due to inductive coupling is cancelled out by inducing a substantially equal and opposite compensating voltage in the sensor leads. For this purpose an inductance coil may be connected into one of the sensor leads and appropriately positioned on one of the welding current conductors. A core-less coil can be employed, and correct adjustment of the compensating voltage can be achieved by adjusting the coil angularly with respect to the axis of the welding current conductor.

9 Claims, 10 Drawing Figures

INDUCTION COMPENSATING METHOD AND APPARATUS FOR WELD NUGGET RESISTANCE SENSING LEADS OF SPOT WELDERS

This invention relates to electric spot welding.

In the control of spot welding it is known to monitor the variation in resistance of the weld nugget by means of sensor leads connected to the welding electrodes, or to the welding current conductors close to the electrodes. A problem which arises is that if the main welding current conductors and the sensor leads are led back together along the arm of the welding machine that carries the electrodes inductive coupling takes place which can seriously interfere with the sensor signal. The problem is particularly severe if large components such as doors, aircraft wing panels and so forth are to be welded necessitating a long welding arm with a deep throat to receive the work.

The inductive coupling is reduced if the sensor leads are connected to the main current conductors farther back along the welding arm. However, this results in a larger voltage across the sensor leads and a corresponding reduction in the ratio to this voltage of the weld nugget voltage drop, making it increasingly difficult to measure the weld nugget voltage drop as the sensor leads are moved back.

The inductive coupling can be avoided if the sensor leads do not run back along the welding arm but are led away from the electrodes in some other direction. But if this is done there is a risk of the work to be welded being fouled by the sensor leads.

It is an object of the present invention to deal with the inductive coupling problem.

According to the present invention, the voltage component that would otherwise appear on the output of the sensor leads due to inductance is substantially cancelled by inducing a substantially equal and opposite compensating voltage in the sensor leads. Preferably, this is achieved by connecting an inductive coil of appropriate design into one of the sensor leads.

Figure 2:
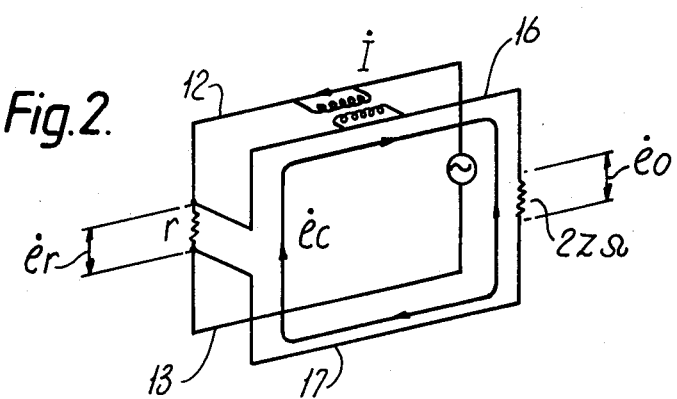
Figure 3:
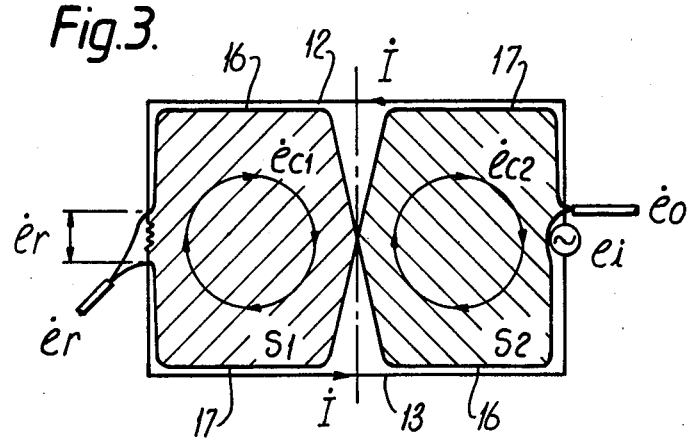
Figure 4:
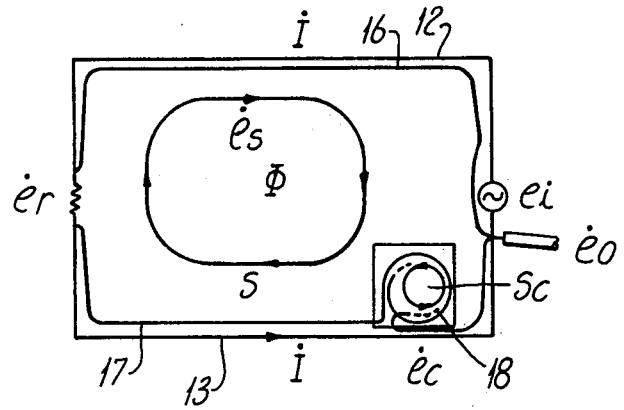
Figure 5:
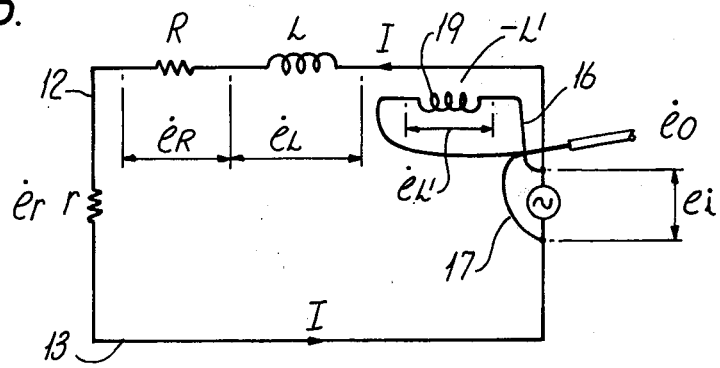
Figure 6:
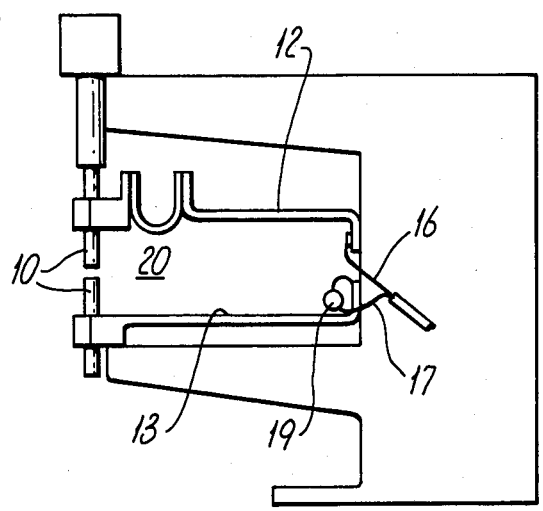
Figure 7:
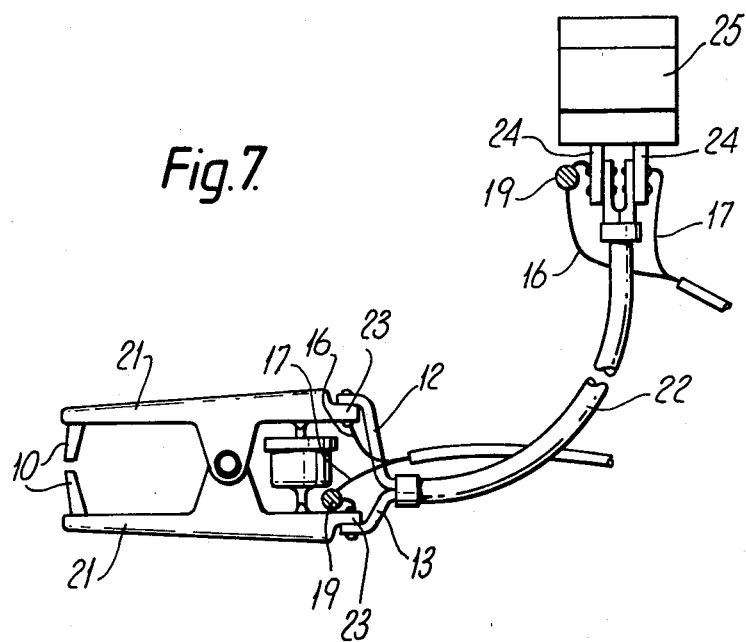
Figure 8:
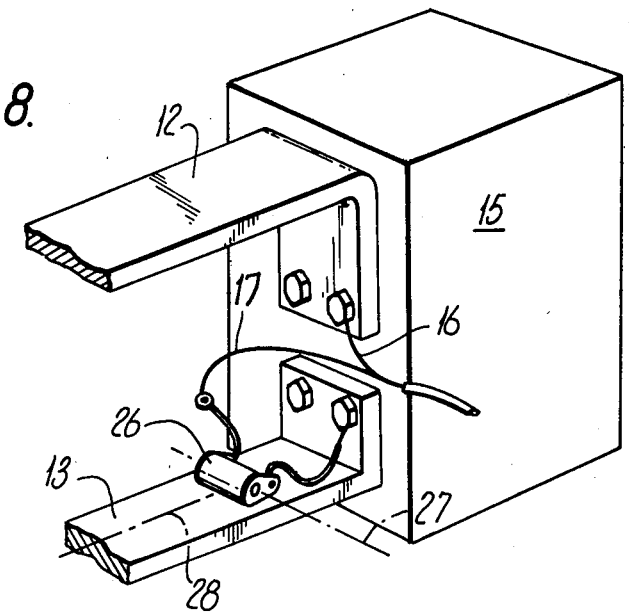
Figure 9:
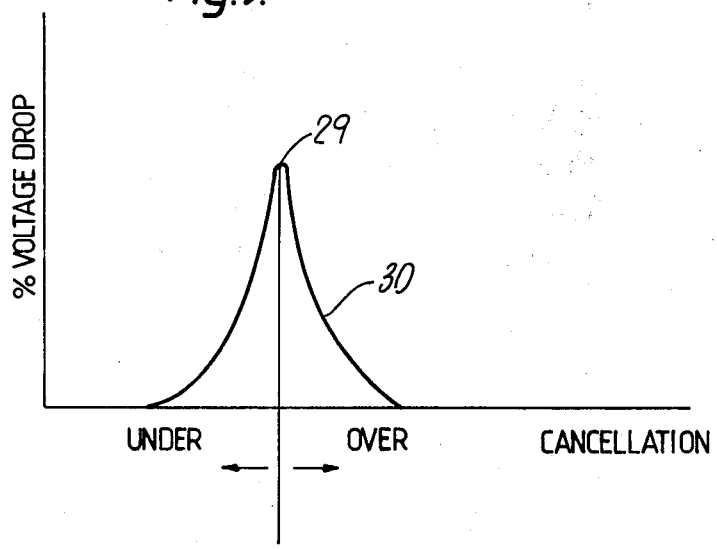
Figure 10:
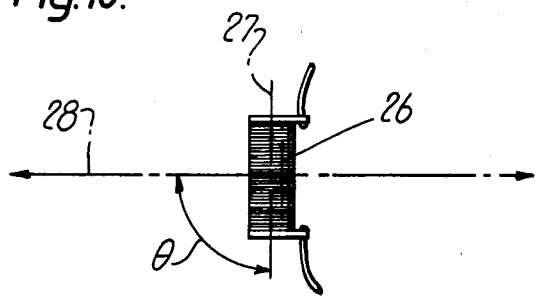

Arrangements according to the invention will now be described by way of example with reference to the accompanying drawings, in which:

FIG. 1 is a diagram of the electrical circuits associated with the welding arm of a spot-welding machine, FIG. 2 is a diagram illustrating the inductive coupling arising with the circuit arrangement of FIG. 1, FIG. 3 is a diagram showing a first way of balancing out the induced voltage, FIG. 4 is a diagram of an arrangement in which compensation for the induced voltage is obtained by employing an inductive coil, FIG. 5 is a diagram of a second arrangement employing an inductive coil, FIG. 6 shows the technique of FIG. 5 applied to a pedestal welding machine, FIG. 7 shows two ways of applying the technique to a portable machine with hinged electrode jaws, FIG. 8 shows an arrangement in which a core-less coil is employed, and FIGS. 9 and 10 are, respectively, a characteristic curve plot and a coil disposition diagram illustrating the manner of coil adjustment in the arrangement of FIG. 8.

FIG. 1 illustrates the electrical circuitry on the welding arm of a spot-welding machine. The work 11 to be welded is placed between welding electrodes 10 fed with welding current by electrical conductors 12, 13 which extend along the welding arm and are connected to the secondary welding 14 of a welding transformer 15. To sense the voltage drop across the electrodes during welding, sensor leads 16, 17 are connected to the main current conductors or the electrodes quite close to the electrode tips. As illustrated in FIG. 2, inductive coupling then occurs between the main current conductors and the sensor leads and this can cause the sensor signal to be entirely swamped or attenuated to such an extent that it is not usable; or the sensor signal polarity may become reversed by induction and the polarity of the signal is important.

FIG. 3 shows a first way of balancing out the induced voltage. The sensor leads are reversed in position on the arm, half-way along the length of the arm, so that for half the length of the arm sensor lead 16 is alongside main current conductor 12 and sensor lead 17 is alongside main current conductor 13, while along the other half of the arm length sensor lead 16 is alongside main current conductor 13 and sensor lead 17 is alongside main current conductor 12. The result is that the voltage component induced in the sensor leads along one half of the arm's length is equal and opposite to the voltage component induced along the other half of the arm's length and these two voltage components cancel out, leaving only the voltage drop across the welding electrodes. However, this techique is not considered to be a satisfactory practical solution.

FIG. 4 shows a scheme in which, instead of reversing the sensor leads as in FIG. 3, a coil 18 wound on an iron core is connected into one sensor lead which coil is so designed and positioned that a voltage component will be induced in it that is equal and opposite to the voltage component induced in the remainder of the sensor leads. If the number of turns, position and orientation of the coil 18 are appropriately determined, substantially complete cancellation of the voltage induced in the sensor leads 16, 17 by the main current conductors 12, 13 can be achieved.

FIG. 5 illustrates how substantial compensation can be achieved if the sensor leads are connected to the main current conductors at the ends of the conductors remote from the electrodes. The voltage across the main conductors at the points of connection has the same value whether seen from the source of the input voltage or from the output side or load. Seen from the load side, the voltage is made up of a component due to the voltage drop across the electrodes (the voltage to be measured), a component due to the resistance R in the conductors and a component due to the inductance L in the conductors. By inserting an inductance coil 19 in one of the sensor leads 16 such that the voltage across this inductance is equal and opposite to the component due to the inductance in the voltage picked off from the main current conductors by the sensor leads, this inductive voltage component is cancelled. The inductance of the coil 19 is denoted by the negative symbol -L' to indicate that, while it should be the same in numerical value, it is opposite in sense to the inductance L in the conductors 12, 13. The voltage sensed then contains only the voltage across the electrodes plus the resistive voltage cmponent and since the former is very much bigger than the latter the latter can be ignored.

FIG. 6 shows the invention applied in practice to a pedestal welding machine in which the sensor leads 16, 17 are connected to the ends of the main current conductors 12, 13 remote from the electrodes 10 and the inductance coil 19 is situated at the base of the throat 20 of the machine also remote from the electrodes. FIG. 7 shows the invention applied to a portable transformer machine. The electrodes 10 are carried on a pair of hinged jaws 21, to terminals 23 at the opposite ends of which the main current conductors 12, 13 are connected. The current conductors run back as a flexible cable 22 to the output terminals 24 of the portable transformer 25. In one arrangement, the sensor leads 16, 17 are connected to the terminals 23 of the jaws 21 and the coil 19 is located close to one of the terminals 23. In another arrangement, the sensor leads are connected to the transformer terminals 24 and the coil 19 is located close to one of those terminals.

It has been discovered that the compensating coil can advantageously be a coil without any core. FIG. 8 shows main current conductors 12, 13 mounted on a transformer 15, with the sensor leads 16, 17 connected to the positions of attachment of the conductors to the transformer. The coil 26 is mounted on the lower current conductor 13 with its axis 27 horizontal and at right angles to the axis 28 of the conductor and the axis of the welding arm, non-electrically-conducting material being interposed between the conductor and the coil.

FIG. 9 is a curve 30 of percentage voltage drop at the electrode tips plotted against the degree of cancellation of the undesired induced voltage. At the correct degree of cancellation the % voltage drop peaks as at 29; on either side of this peak under-or over-cancellation causes the % voltage drop to decrease rapidly. The degree of cancellation can be adjusted to the optimum by changing the angle $\theta$ between the axis 27 of the coil 26 and the direction of the welding arm (FIG. 10).

To achieve cancellation in a practical case, the sensor leads are first attached to the electrodes and are led away in a direction away from the throat of the welding arm and the main current conductors so that there is no inductive coupling. Welding is performed and the weld termination point as indicated by the observed weld nugget voltage drop is determined. The sensor leads are then disconnected and reconnected at the positions shown in FIG. 8, and the cancelling coil 26 is introduced. If the weld termination point as indicated by the weld nugget voltage drop is the same as before, then the degree of cancellation is correct. If the weld termination point is different (usually if different it will be later) then the angle of the coil to the welding arm is adjusted until the weld termination point is the same as in the case of no inductive coupling.

I claim:
1. In an electrical spot-welding machine having a welding head including a pair of relatively movable electrodes for gripping the work to be welded and main welding current conductors, a method of compensating for inductive coupling between the main welding current conductors and the electrical sensor leads that monitor weld nugget resistance across the work to be welded, said method comprising the steps of:
   (a) temporarily connecting the sensor leads to the welding electrodes and positioning said sensor leads along paths away from said current conductors so that there is no inductive coupling therebetween;
   (b) performing a welding cycle and recording the instant during the cycle at which the weld nugget voltage drop as represented by the sensor lead signal indicates the weld termination point, when there is no inductive coupling between the sensor leads and the current conductors;
   (c) re-positioning the sensor leads so that they are connected to the current conductors at desired final points of connection and laid along desired final paths such as are appropriate when the machine is in commercial use;
   (d) connecting into one of said leads an inductive compensating coil that is mounted on the welding head close to at least one main current conductor in an angularly adjustable manner; and
   (e) performing welding cycles and adjusting the angular position of the compensating coil until an angular orientation of the coil is achieved at which the weld termination point as indicated by the sensor lead signal representing weld nugget voltage drop occurs at the same instant in a welding cycle when said sensor leads are repositioned as when said sensor leads are temporarily positioned along paths away from said conductors.

2. A method as in claim 1 comprising the further step of:
   fixing the compensating coil on the welding head in said angular orientation to which it has been adjusted.

3. A method according to claim 2, wherein the compensating coil has an inductive core.

4. A method according to claim 2, wherein the compensating coil is a core-less coil.

5. A method according to claim 2 wherein the compensating coil is mounted on one of the welding current conductors.

6. An electrical spot-welding machine comprising:
   a welding head including a pair of relatively movable electrodes for gripping the work to be welded and a pair of main welding current conductors extending to said electrodes along longitudinal axes that are about parallel to one another;
   a welding current supply circuit connected to said current conductors;
   a pair of electrical sensor leads connected each to a respective one of said current conductors to provide a signal representative of the voltage drop between said electrodes for use in machine control;
   an inductive compensating coil; and
   means for adjustably coupling said compensating coil along one of said sensor leads, said coil being mounted on one of said current conductors;
   the axis of said coil being adjusted to and fixed at a determined non-perpendicular angular orientation with respect to the plane containing the longitudinal axes of said current conductors such as to compensate for such undesirable inductive component as would otherwise appear in the sensor lead signal.

7. A method according to claim 6, wherein the sensor leads are connected at or close to the welding electrodes and are led back along the welding current conductors.

8. A machine according to claim 6, wherein the sensor leads are connected to the ends of the welding current conductors remote from the welding electrodes.

9. A machine according to claim 8, wherein the welding electrodes are carried on hinged jaws which also constitute the welding current conductors, and the compensating coil is mounted on one of the jaws at a position remote from the electrodes.

* * * * *